(12) United States Patent
Matsuda

(10) Patent No.: US 10,270,006 B2
(45) Date of Patent: Apr. 23, 2019

(54) LIGHT EMITTING DEVICE AND LIGHT EMITTING MODULE

(71) Applicant: LG INNOTEK CO., LTD., Seoul (KR)

(72) Inventor: Shuhei Matsuda, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/740,388

(22) PCT Filed: Jul. 1, 2016

(86) PCT No.: PCT/KR2016/007111
§ 371 (c)(1),
(2) Date: Dec. 28, 2017

(87) PCT Pub. No.: WO2017/007181
PCT Pub. Date: Jan. 12, 2017

(65) Prior Publication Data
US 2018/0190868 A1 Jul. 5, 2018

(30) Foreign Application Priority Data
Jul. 3, 2015 (KR) .................. 10-2015-0095455

(51) Int. Cl.
*H01J 1/62* (2006.01)
*H01L 33/36* (2010.01)
(Continued)

(52) U.S. Cl.
CPC .............. *H01L 33/36* (2013.01); *H01L 33/60* (2013.01); *H01L 33/62* (2013.01); *H01L 33/64* (2013.01);
(Continued)

(58) Field of Classification Search
USPC ........................ 313/505, 506, 498
See application file for complete search history.

(56) References Cited

U.S. PATENT DOCUMENTS

2007/0290329 A1  12/2007 Murayama et al.
2014/0301054 A1   9/2014 Nagai et al.

FOREIGN PATENT DOCUMENTS

JP  2008/021987  1/2008
JP  2013-122951  6/2013
(Continued)

OTHER PUBLICATIONS

International Search Report (with English Translation) and Written Opinion dated Nov. 4, 2016 issued in Application No. PCT/KR2016/007111.

*Primary Examiner* — Vip Patel
(74) *Attorney, Agent, or Firm* — KED & Associates, LLP

(57) ABSTRACT

A light emitting device disclosed in an embodiment includes: a light emitting chip including a light emitting part, including a plurality of semiconductor layers, and a first electrode and a second electrode under the light emitting part; a first support member under the light emitting chip; a second support member under the first support member; a first lead electrode connected to the first electrode and a second lead electrode connected to the second electrode, in the second support member, the first lead electrode being separated from the second lead electrode; a protection chip disposed between the first and second lead electrodes; and a reflective member disposed on a periphery of the light emitting chip, wherein the first support member includes a ceramic material between the second support member and the light emitting chip.

20 Claims, 8 Drawing Sheets

(51) Int. Cl.
*H01L 33/60* (2010.01)
*H01L 33/62* (2010.01)
*H01L 33/64* (2010.01)
*H05B 33/08* (2006.01)

(52) U.S. Cl.
CPC .......... *H05B 33/08* (2013.01); *H01L 2224/42* (2013.01); *H01L 2224/48091* (2013.01)

(56) References Cited

FOREIGN PATENT DOCUMENTS

| | | |
|---|---|---|
| JP | 2015-043374 | 3/2015 |
| KR | 10-2013-0032202 | 4/2013 |
| KR | 10-2015-0042012 | 4/2015 |

LIGHT EMITTING DEVICE AND LIGHT EMITTING MODULE

CROSS-REFERENCE TO RELATED PATENT APPLICATIONS

This application is a U.S. National Stage Application under 35 U.S.C. § 371 of PCT Application No. PCT/KR2016/007111, filed Jul. 1, 2016, which claims priority to Korean Patent Application No. 10-2015-0095455, filed Jul. 3, 2015, whose entire disclosures are hereby incorporated by reference.

TECHNICAL FIELD

Embodiments relate to a light emitting device and a light emitting module including the same.

BACKGROUND ART

A light emitting device, for example, a light emitting diode is a type of semiconductor device which converts electrical energy into light, and are attracting much attention as a next-generation light source by replacing conventional fluorescent lamps and incandescent lamps.

Since the light emitting diode generates light by using a semiconductor device, the light emitting diodes consume only a very low power in comparison with incandescent lamps, which heat tungsten to generate light, or fluorescent lamps which cause a phosphor to collide with ultraviolet generated through high pressure discharge to generate light.

The light emitting diode is used as a light source for lighting devices such as various lamps, liquid crystal displays, electronic display boards, street lamps, and indicating lamps used at indoor and outdoor places, and the use of the light emitting diode as the light source is increasing.

DISCLOSURE

Technical Problem

Embodiment provides a light emitting device having a new heat dissipation structure.

Embodiment provides a light emitting device including a different type of support members under a light emitting chip.

Embodiment provides a light emitting device and a light emitting module including the same, in which a first support member including a ceramic material and a second support member including a lead electrode are stacked under a light emitting chip.

Embodiment provides a light emitting device and a light emitting module including the same, in which a protection chip is provided on a top surface or a bottom surface of a ceramic substrate, between lead electrodes, and under a light emitting chip.

Technical Solution

A light emitting device according to an embodiment includes: a light emitting chip including a light emitting part, including a plurality of semiconductor layers, and a first electrode and a second electrode under the light emitting part; a first support member under the light emitting chip; a second support member under the first support member; a first lead electrode connected to the first electrode and a second lead electrode connected to the second electrode, in the second support member, the first lead electrode being separated from the second lead electrode; a protection chip disposed between the first and second lead electrodes; and a reflective member disposed on a periphery of the light emitting chip, wherein the first support member includes a ceramic material between the second support member and the light emitting chip.

A light emitting device according to an embodiment includes: a light emitting chip including a light emitting part, including a plurality of semiconductor layers and a transmissive substrate, and a first electrode and a second electrode under the light emitting part; a first support member under the light emitting chip; a second support member between the first support member and the light emitting chip; a first lead electrode connected to the first electrode and a second lead electrode connected to the second electrode, in the second support member, the first lead electrode being separated from the second lead electrode; a protection chip disposed between the first and second lead electrodes; and a reflective member disposed on a periphery of the light emitting chip, wherein the first support member includes a ceramic material.

A light emitting module according to an embodiment includes: a light emitting device including: a light emitting chip including a light emitting part, including a plurality of semiconductor layers, and a first electrode and a second electrode under the light emitting part; a first support member under the light emitting chip; a second support member under the first support member; a first lead electrode connected to the first electrode and a second lead electrode connected to the second electrode, in the second support member, the first lead electrode being separated from the second lead electrode; a protection chip disposed between the first and second lead electrodes; and a reflective member disposed on a periphery of the light emitting chip, wherein the first support member includes a ceramic material between the second support member and the light emitting chip; a circuit board including first and second electrode pads under the light emitting device; and a bonding member disposed between the circuit board and the light emitting device, wherein the first and second lead electrodes of the light emitting device are connected to the first and second electrode pads of the circuit board by the bonding member.

Advantageous Effect

Embodiments provide a light emitting device including a protection chip under a flip type light emitting chip.

In embodiments, the protection chip is disposed on a top surface or a bottom surface of a ceramic substrate under the light emitting chip, thereby reducing a thickness of the light emitting device.

In embodiments, heat dissipation efficiency can be prevented from being reduced.

In embodiments, a thermal stress applied to the light emitting chip included in the light emitting device can be reduced.

Embodiments can provide a light emitting device with improved light extraction efficiency.

In embodiments, the reliability of the light emitting device and the light emitting module including the same can be improved.

MODE FOR INVENTION

Figure 1:
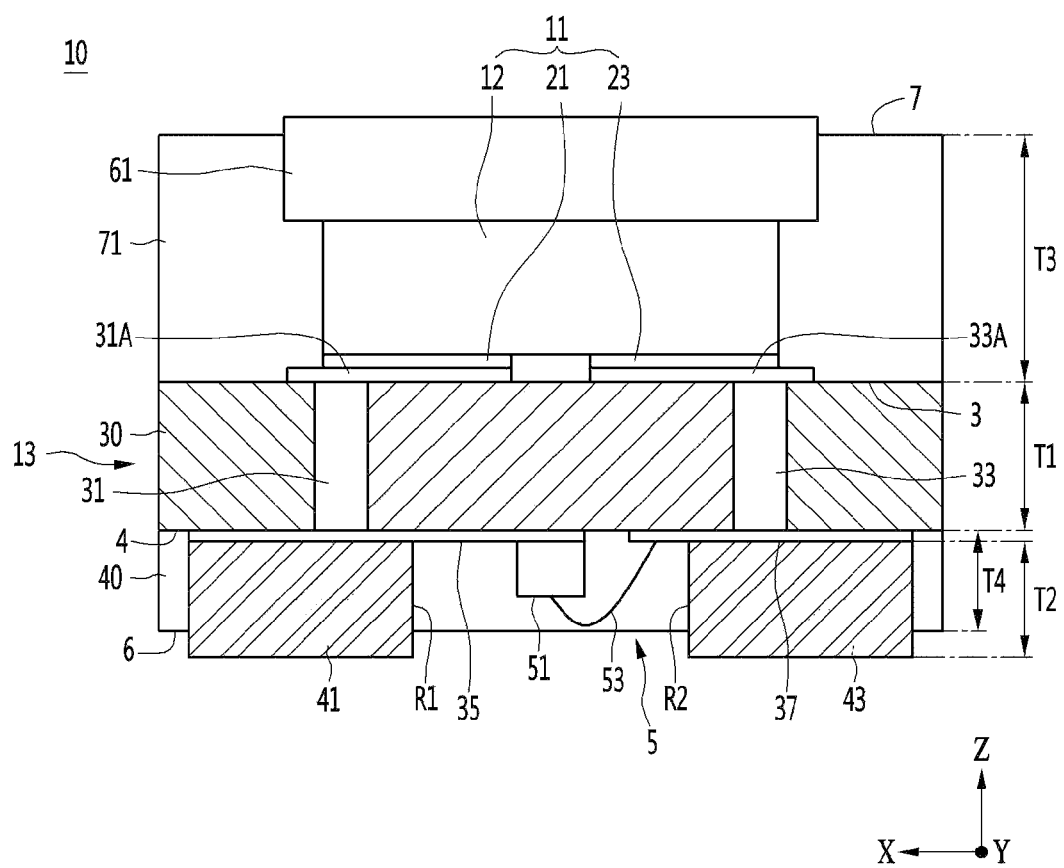
FIG. 1 is a side cross-sectional view illustrating a light emitting device according to a first embodiment.

Hereinafter, embodiments will be clearly disclosed through descriptions of the embodiments and the accompanying drawings. In the description of embodiments, it will be understood that when a layer (or film), region, pattern or structure is referred to as being 'on' another layer (or film), region, pad or pattern, the terminology of 'on' and 'under' includes both the meanings of 'directly' and 'indirectly'. Furthermore, the reference about 'on' and 'under' each layer will be made on the basis of drawings.

Hereinafter, a light emitting device according to embodiments will be described with reference to the accompanying drawings. Like or corresponding reference numerals refer to like elements throughout, and repetitive descriptions are omitted.

Figure 2:
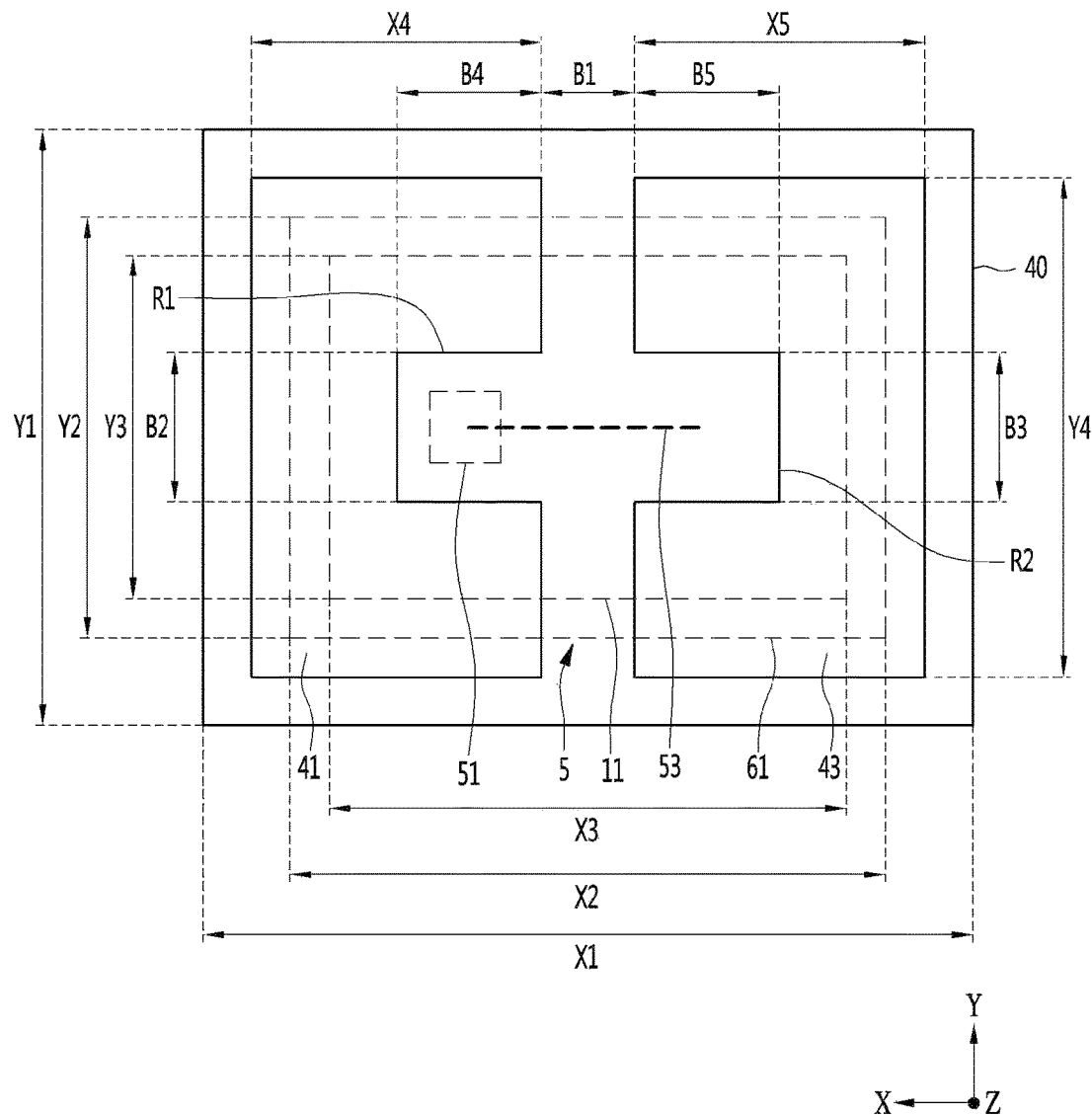
FIG. 2 is a bottom view of the light emitting device of FIG. 1.

FIG. 1 is a side cross-sectional view illustrating a light emitting device according to a first embodiment, and FIG. 2 is a bottom view of the light emitting device of FIG. 1.

Referring to FIGS. 1 and 2, a light emitting device 10 includes a light emitting chip 11, a first support member 30 including a plurality of via electrodes 31 and 33 under the light emitting chip 11, a second support member 40 including a plurality of lead electrodes 41 and 43 under the first support member 30, a protection chip 51 disposed between the plurality of lead electrodes 41 and 43, and a reflective member 71 disposed on a periphery of the light emitting chip 11.

The light emitting device 10 may emit at least one of blue light, green light, red light, and white light. The light emitting device 10 can prevent a side leakage of the light emitted from the light emitting chip 11 and may output the light through a top surface.

The light emitting chip 11 may selectively emit light within a range from a visible light band to an ultraviolet band. The light emitting chip 11 may include at least one of, for example, an ultraviolet (UV) light emitting diode (LED), a red LED, a blue LED, a green LED, a yellow green LED, an infrared LED, and a white LED. The light emitting chip 11 may include a light receiving device or a light detecting device. The light emitting chip 11 may include an LED or a laser diode.

The light emitting chip 11 may include at least one of a horizontal chip structure, where two electrodes in a chip are disposed adjacent to each other, and a vertical chip structure where two electrodes are disposed opposite to each other, but is not limited thereto. The light emitting chip 11 according to an embodiment may be disposed as a flip chip type. In the flip chip type light emitting chip 11, two electrodes 21 and 23 may be disposed at a lower portion in parallel, but are not limited thereto. The light emitting chip 11 may include the electrodes 21 and 23 which are disposed at the lower portion, and the electrodes 21 and 23 disposed at the lower portion may be an anode terminal and a cathode terminal.

A top surface of the light emitting chip 11 may include a concave-convex structure for light extraction, and the concave-convex structure may change a threshold angle of emitted light. Also, the concave-convex structure can improve a contact area contacting with a phosphor layer 61. The light emitting chip 11 may include a transmissive substrate, for example, a sapphire substrate in an upper portion, but is not limited thereto.

The light emitting chip 11 may include a plurality of electrodes, for example, a first electrode 21 and a second electrode 23 at a lower portion, and the first electrode 21 and the second electrode 23 may be disposed at the lower portion of the light emitting chip 11 and may be separated from each other. The first electrode 21 and the second electrode 23 may be formed of at least one of gold (Au), nickel (Ni), chromium (Cr), tantalum (Ta), platinum (Pt), tin (Sn), silver (Ag), phosphorus (P), titanium (Ti), palladium (Pd), and copper (Cu), or a selective alloy thereof, and may be formed of a single layer or a multilayer. At least one of the first electrode 21 and the second electrode 23 may include an arm pattern, and the arm pattern may diffuse a current.

The light emitting chip 11 may include a light emitting part 12, and the light emitting part 12 may include a plurality of semiconductor layers, and for example, may include a light emitting structure including a first conductive semiconductor layer, an active layer, and a second conductive semiconductor layer. The light emitting part 12 may include a transmissive substrate on the light emitting structure. The light emitting part 12 may be electrically connected to the first and second electrodes 21 and 23. The first and second electrodes 21 and 23 may be disposed under the light emitting part 12.

A support member 13 is disposed under the light emitting chip 11. The support member 13 may include a different type of support members having different thermal expansion coefficients. The support member 13 includes a first support member 30 for the light emitting chip 11 and a second support member 40 under the first support member 30. One of the different support members may include a ceramic material, and the other may be a metal support member.

One of the different type of the support members may be adjacent to the light emitting chip 11, and the other may be disposed under the one support member. The first and second support members 30 and 40 may include different materials.

The first support member 30 may include a non-metal or ceramic material and may be a heat dissipation substrate or a ceramic substrate. The second support member 40 may include a resin material and may be a resin substrate or an insulation substrate. If the protection chip 51 is removed, a member which seals the protection chip 51 is removed, and thus, the second support member 40 may be formed as the lead electrodes 41 and 43, but is not limited thereto.

The first support member 30 may include a material which is higher in thermal conductivity than and lower in thermal resistance than a resin material. The first support member 30 may be formed of, for example, oxide, carbide, or nitride which is produced by combining a metal element such as silicon (Si), aluminum (Al), titanium (Ti), or zirconium (Zr) with oxygen, carbon, nitrogen, or the like. The first support member 30 may include nitride aluminum (AlN). As another example, the first support member 30 may include at least one of silicon carbide (SiC), alumina (Al2O3), zirconium oxide (ZrO2), silicon nitride (Si3N4), boron nitride (BN).

In a thermal conductivity, AlN may be 70 to 250 W/mK, BN may be 60 to 200 W/mK, Si3N4 may be 60 to 90 W/mK, Si may be 150 W/mK, SiC may be 270 W/mK, and Al2O3 and ZrO2 may be 20 to 30 W/mK. The first support member 30 may include a material which has a thermal conductivity of 60 W/mK for heat dissipation. The first support member 30 may be formed of a material having a thermal conductivity which is higher than that of the second support member 40. Accordingly, the first support member 30 can effectively dissipate heat conducted through the light emitting chip 11.

The first support member 30 includes pads 31A and 33A and via electrodes 31 and 33. The pads 31A and 33A include a first pad 31A, which is disposed on a top surface 3 of the first support member 30 and is connected to the first electrode 21, and a second pad 33A connected to the second electrode 23. The via electrodes 31 and 33 include a first via electrode 31 connected to the first electrode 21 and a second via electrode 33 connected to the second electrode 23. The first via electrode 31 may be connected to the first electrode 21 through the first pad 31A, and the second electrode 33 may be connected to the second electrode 23 through the second pad 33A.

The first and second pads 31A and 33A may include a conductive material and may be formed of metal, for example, at least one of gold (Au), nickel (Ni), chromium (Cr), tantalum (Ta), platinum (Pt), tin (Sn), silver (Ag), phosphorus (P), titanium (Ti), palladium (Pd), and copper (Cu), or a selective alloy thereof. The first and second pads 31A and 33A may be formed of a single layer or a multilayer. The first and second via electrodes 31 and 33 may be formed to have the same height as a thickness T1 of the first support member 30 or may be formed higher than the thickness T1. The first and second via electrodes 31 and 33 may include a conductive material, for example, a metal material. The first and second via electrodes 31 and 33 may be formed of at least one of gold (Au), nickel (Ni), chromium (Cr), tantalum (Ta), platinum (Pt), tin (Sn), silver (Ag), phosphorus (P), titanium (Ti), palladium (Pd), and copper (Cu), or a selective alloy thereof, and may be formed of a single layer or a multilayer.

In the first support member 30, first and second metal layers 35 and 37 may be disposed on a bottom surface, the first metal layer 35 may be connected to the first via electrode 31, and the second metal layer 37 may be connected to the second via electrode 33. The first metal layer 35 may overlap the first via electrode 31 and may be disposed between the first support member 30 and the second support member 40, and the second metal layer 37 may overlap the second via electrode 31 in a vertical direction and may be disposed between the first support member 30 and the second support member 40. The first and second metal layers 35 and 37 may include at least one of gold (Au), copper (Cu), titanium (Ti), and nickel (Ni) and may be formed of a single layer or a multilayer.

The first and second metal layers 35 and 37 may be included in the first support member 30 or the second support member 40. Also, the first and second metal layers 35 and 37 may be formed as separated elements between the first and second support members 30 and 40, but are not limited thereto.

The second support member 40 is disposed under the first support member 30. The second support member 40 may have a thermal conductivity which is lower than that of the first support member 30. A thickness of the second support member 40 may be thinner than the thickness T1 of the first support member 30.

The second support member 40 may include a resin material, for example, at least one of silicon, epoxy, fluoro resins (FR), and composite epoxy materials (CEM). The second support member 40 may include a thermal conductive film. The thermal conductive film may use polyester resins such as polyethylene terephthalate, polybutylene terephthalate-laid, and polyethylene terephthalate; polyimide resin; acrylic resin; styrene-based resin such as polystyrene and acrylonitrile-styrene; polycarbonate resin; polylactic acid resin; polyurethane resin, etc. Also, the thermal conductive film may include polyolefin resins such as polyethylene, polypropylene, and ethylene-propylene copolymer; vinyl resins such as polyvinyl chloride and polyvinylidene chloride; polyamide resin; sulfone-based resin; polyether-ether ketone-based resin; allylate-based resin; or at least one of blends of the resins.

The first and second lead electrodes 41 and 43 are disposed in the second support member 40. The first and second lead electrodes 41 and 43 may be included in the second support member 40 or may be provided as separate metal support members, but are not limited thereto. The first lead electrode 41 may be disposed under the first metal layer 35, and the second lead electrode 43 may be disposed under the second metal layer 37. The first lead electrode 41 may be electrically connected to the first metal layer 35, and thus, may be connected to the first electrode 21 of the light emitting chip 11 through the first via electrode 31. The second lead electrode 43 may be electrically connected to the second metal layer 37, and thus, may be connected to the second electrode 23 of the light emitting chip 11 through the second via electrode 33.

A bottom surface of each of the first lead electrode 41 and the second lead electrode 43 may protrude more downward than a bottom surface 6 of the second support member 40. When the first and second lead electrodes 41 and 43 protrude to a portion under the bottom surface 6 of the second support member 40, an adhesive force with an adhesive member such as a solder can be improved. As another example, the bottom surface of each of the first lead electrode 41 and the second lead electrode 43 may be disposed on the same horizontal plane as the bottom surface 6 of the second support member 40. In this case, the bottom surface of each of the first lead electrode 41 and the second lead electrode 43 may have an area which is wider than a top surface.

As in FIG. 2, a length X1 of the second support member 40 in a first axis direction may be equal to or different from a length Y1 of the second support member 40 in a second axis direction. An area of a bottom surface of the second support member 40 may be the same as an area of a bottom surface 4 of the first support member 30 illustrated in FIG. 1. An area of the bottom surface of the second support member 40 may be equal to or wider than an area of a top surface 7 of the reflective member 71.

Comparing a length of the second reflective member 40 with a length of the light emitting chip 11, the first axis direction may have a relationship "X1>X3", and the second axis direction may have a relationship "Y1>Y3". In this case, the light emitting chip 11 may stably support and fix internal lead electrodes 41 and 43. A length Y4 of each of the lead electrodes 41 and 43 in the second axis direction may be set longer than Y2, thereby increasing a heat dissipation area in the second direction vertical to the first direction and improving heat dissipation efficiency. The first and second lead electrodes 41 and 43 may be disposed to extend outward more than a region of the light emitting chip 11, thereby increasing a heat dissipation area in the first axis and second axis directions.

A thickness T2 of each of the first and second lead electrodes 41 and 43 may be equal to or thicker than a thickness T4 of the second support member 40. Therefore, a heat dissipation efficiency of the first and second lead electrodes 41 and 43 can be improved in the second support member 40. The first and second lead electrodes 41 and 43 may be formed of at least one of gold (Au), nickel (Ni), chromium (Cr), tantalum (Ta), platinum (Pt), tin (Sn), silver (Ag), phosphorus (P), titanium (Ti), palladium (Pd), and copper (Cu), or a selective alloy thereof, and may be formed of a single layer or a multilayer. The first and second lead electrodes 41 and 43 may include, for example, copper or a copper alloy.

The first and second lead electrodes 41 and 43 supply power and conduct or dissipate heat conducted from the first support member 30. The first and second lead electrodes 41 and 43 may have a certain size, for a heat dissipation surface area. The T2 of each of the first and second lead electrodes 41 and 43 may be equal to or greater than one half (½) of the thickness T1 of the first support member 30 or may be equal to or less than the thickness T1 of the first support member 30. If the thickness T1 of the first support member 30 is less than ½ of the thickness T2 of each of the first and second lead electrodes 41 and 43, heat transfer efficiency can be reduced. The thickness T2 of each of the first and second lead electrodes 41 and 43 is set within a range of 0.51T1 to T1, and thus, heat conducted through the first support member 30 can be effectively dissipated.

The thickness T2 of each of the first and second lead electrodes 41 and 43 may have a value which is greater than a value obtained by summating a thickness of the protection chip 51 and a low-point height of a wire 53, and may be set to 0.15 mm or more, for example, within a range of 0.18 mm to 0.3 mm. If the thickness T2 of each of the first and second lead electrodes 41 and 43 is less than the range, a low point of the wire 53 is exposed to a portion under the first and second lead electrodes 41 and 43 or is exposed to a bottom surface of the second support member 40, and thus, electrical reliability can be reduced. If the thickness T2 of each of the first and second lead electrodes 41 and 43 is thicker than the range, there is a problem where a thickness of the light emitting device 10 is thickened.

A thickness "T1+T2" of the support member 13 may vary based on a thickness ratio of the first support member 30 and the first and second lead electrodes 41 and 43. A thickness based on a thermal resistance of the support member 13 may be set and will be described with reference to FIGS. 8 to 10.

Figure 8:
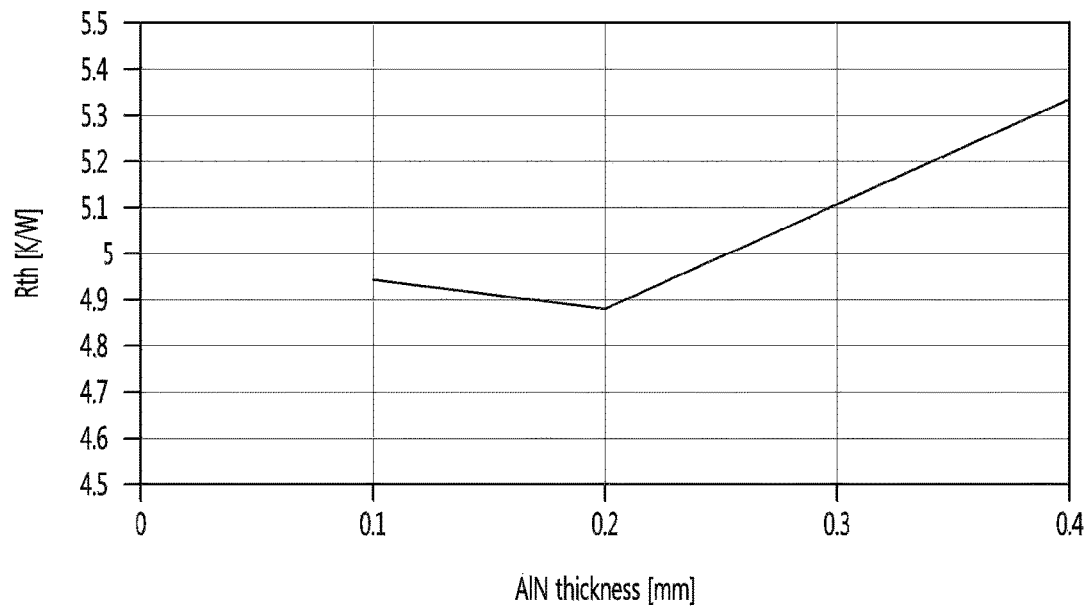
FIG. 8 is a graph showing a change in thermal resistance value with respect to a thickness of a ceramic layer, in a light emitting device according to an embodiment.

FIG. 8 is a graph showing a relationship between a material and a thermal resistance value of the first support member 30, in a light emitting device according to an embodiment. The first support member 30 illustrated in FIG. 1, a ceramic material, includes AlN, and it can be seen that a thermal resistance value is reduced up to a thickness of 0.2 mm in AlN, but when exceeding 0.2 mm±0.02 mm, the thermal resistance value increases incrementally. The first support member 30 may have a thickness within a range of 0.2 mm±0.02 mm in consideration of the thermal resistance value, and by lowering the thermal resistance value due to the thickness range, heat may be diffused through a whole surface.

Figure 9:
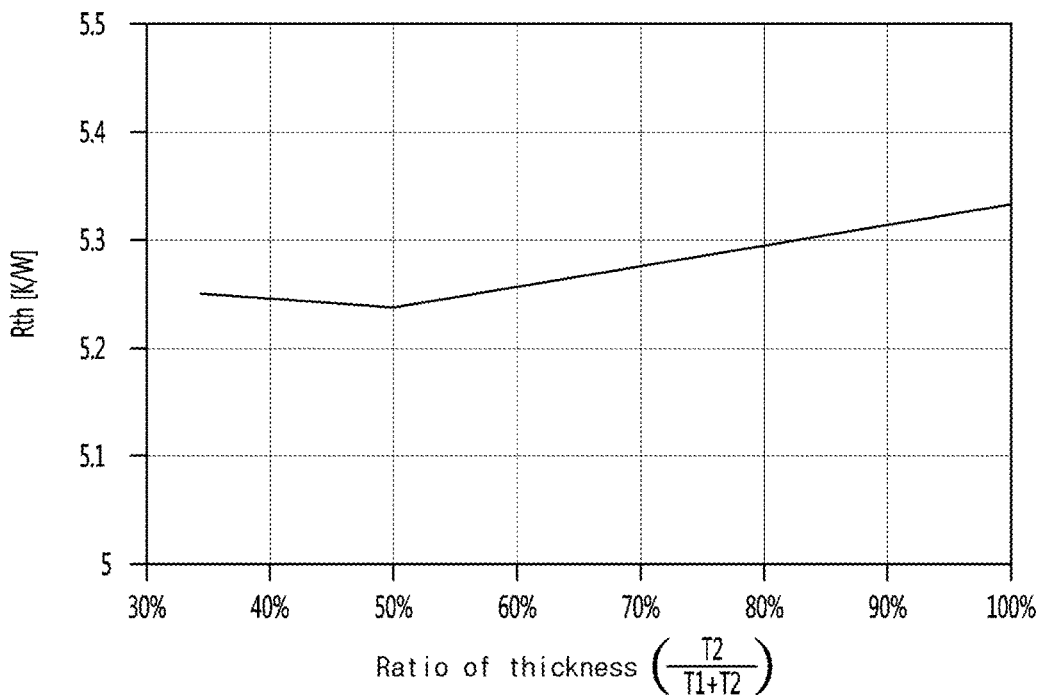
FIG. 9 is a graph showing a change in thermal resistance value with respect to a ratio of a thickness of a first support member and a thickness of a lead electrode, in a light emitting device according to an embodiment.

FIG. 9 is a diagram showing a thermal resistance value with respect to a ratio of the thickness T2 of the lead electrodes 41 and 43 to a total thickness "T1+T2" of the support member 13, in a light emitting device according to an embodiment.

Referring to FIG. 9, it can be seen that when a ratio of the thickness T2 of the lead electrodes 41 and 43 to a total thickness "T1+T2" of the support member 13 and the lead electrodes 41 and 43 illustrated in FIG. 1 is a ratio of 50%±10%, the thermal resistance value is the lowest. That is, when the thickness T2 of the lead electrodes 41 and 43 is set to a ratio "T2/(T1+T2)" corresponding to a range of 40% to 60% of the thickness "T1+T2", it can be seen that the thermal resistance value of the light emitting device 10 is lowed. In this case, the ratio is set under a condition where the thickness "T1+T2" of the support member 13 is constant, and the thickness T2 of the lead electrodes 41 and 43 are changed.

Figure 10:
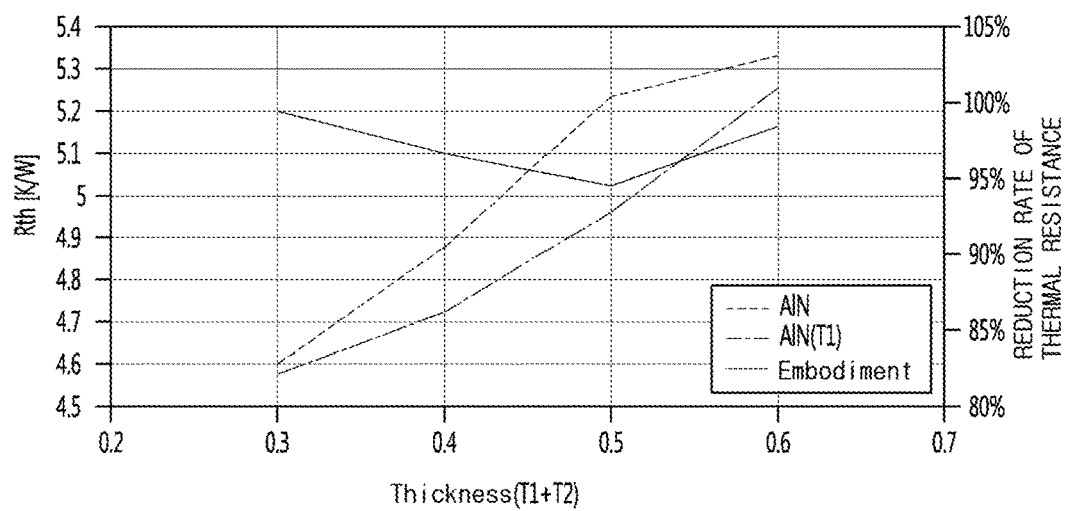
FIG. 10 is a graph showing a reduction rate of a thermal resistance and a thermal resistance value with respect to a thickness of a first support member/lead electrode of the present invention and a comparative example according to an embodiment.

FIG. 10 is a diagram showing comparison of a comparative example and an embodiment with respect to a total thickness of a support member according to an embodiment.

Referring to FIG. 10, the comparative example is a light emitting device where a ceramic substrate (for example, AlN) is stacked in plurality, and it can be seen that as a thickness of the ceramic substrate (AlN) increases, a thermal resistance value increases incrementally.

Moreover, when a thickness T1 of the ceramic substrate (AlN) which is the first support member is fixed to 0.2 mm±0.02 mm as in an embodiment, it can be seen that an increase in thermal resistance value is reduced in comparison with the comparative example. That is, when the thickness T1 of the first support member is greater than the thickness, a problem where the thermal resistance value increases again can occur, and thus, a stacked structure of the first support member and a lead electrode is provided. An experiment has been performed under where the lead electrode is Cu.

Moreover, a thickness ratio in the support member 13 of an embodiment is a thickness ratio of the first support member/lead electrode, and for example, when a ratio of AlN/Cu is within a range of 40% to 55%, it can be seen that a reduction rate of a thermal resistance is high. In this case, if a total thickness "T1+T2" of the support member is set in consideration of the ratio, the total thickness may be equal to or less than 0.5 mm, for example, within a range of 0.36 mm to 0.5 mm.

In an embodiment, the first support member 30 including a ceramic material is disposed between the first and second lead electrodes 41 and 43 and the light emitting chip 11, and thus, when an adhesive member such as a solder is adhered to a circuit board, a thermal stress transferred to the light emitting chip 11 can be reduced. Also, when the first and second lead electrodes 41 and 43 include copper (Cu), a thermal expansion coefficient difference with the adhesive member can be reduced, and thus, a crack of the adhesive member can be prevented.

The second support member 40 may include the protection chip 51. The protection chip 51 may be disposed under at least one of the first and second metal layers 35 and 37. The protection chip 51 may be electrically connected to the first and second metal layers 35 and 37. The protection chip 51 may be disposed under the first metal layer 35 and may be connected to the second metal layer 37 by the wire 53.

The protection chip 51 and the wire 53 are sealed in the second support member 40, and thus, can be prevented from being exposed to the outside and can be electrically protected.

As in FIG. 2, a first recess R1 may be disposed in the first lead electrode 41, and a second recess R2 may be disposed in the second lead electrode 43. The first recess R1 may be concavely recessed in a direction from a gap 5 between the first and second lead electrodes 41 and 43 to the first lead electrode 41 or a first side surface of the second support member 40, and the second recess R2 may be concavely recessed in a direction from the gap 5 between the first and second lead electrodes 41 and 43 to the second lead electrode 43 or a second side surface of the second support member 40. The first side surface and the second side surface may be opposite side surfaces. A width B1 of the gap 5 between the first and second lead electrodes 41 and 43 may have a relationship "B4>B1" or "B5>B1". The B1 denotes a depth of the first recess R1, and the B5 denotes a depth of the second recess R2. Here, an interval B1 between the first and second lead electrodes 41 and 43 is set greater than an interval between the first and second electrodes 21 and 23, and thus, heat can be prevented from concentrating on a region between the first and second lead electrodes 41 and 43.

An area of the top surface or bottom surface of the first lead electrode 41 is set greater than an area of the bottom surface of the first electrode 21, and thus, heat dissipation efficiency based on the first lead electrode 41 can be improved. An area of the top surface or bottom surface of the second lead electrode 43 is set greater than an area of a bottom surface of the second electrode 23, and thus, heat dissipation efficiency based on the second lead electrode 43 can be improved.

Referring to FIGS. 1 and 2, a bottom view shape of the first recess R1 may be a polygonal shape, an elliptical shape, or a hemispherical shape. The first recess R1 may have the same height as the thickness T4 of the first lead electrode 41 and may have a depth B4 which is equal to or less than ½ of the width X4 of the first lead electrode 41. When the height of the first recess R1 is low, it is not easy to mount the protection chip 51, and when the depth B4 of the first recess R1 is greater than ½ of the width X4, a heat dissipation area can be reduced.

A bottom view shape of the second recess R2 may be a polygonal shape, an elliptical shape, or a hemispherical shape. The second recess R2 may have the same height as the thickness T4 of the second lead electrode 43 and may have a depth B5 which is equal to or less than ½ of a width X5 of the second lead electrode 43. When the height of the second recess R2 is low, it is not easy to bond the wire, and when the depth B5 of the second recess R2 is greater than ½ of the width X5, a heat dissipation area can be reduced.

The widths B2 and B3 of the first and second recesses R1 and R2 may be the same or differ, and when the widths B2 and B3 differ, the widths B2 and B3 may have a relationship "B2>B3". The first and second recesses 51 and 53 may have the same size, and the heat dissipation characteristics of the first and second lead electrodes 41 and 43 can be uniform. As another example, an area of the first recess R1 where the protection chip 51 is disposed may be set greater than that of the second recess R2 where an end of the wire 53 is disposed.

As in FIG. 1, the first metal layer 35 may be disposed in the first recess R1, and the second metal layer 37 may be disposed in the second recess R2. The protection chip 51 may be disposed in the first recess R1, and the end of the wire 53 may be disposed in the second recess R2. The protection chip 51 and the wire 53 may be connected to the first and second metal layers 37 in the first and second recesses R1 and R2, thereby protecting the light emitting chip 11. As another example, the protection chip 51 may be disposed in the second recess R2, and the wire 53 may be disposed in the first recess R1. However, the present embodiment is not limited thereto.

The first and second recesses R1 and R2 may be disposed in a lower center region of the light emitting device 10, or may be disposed in a region deviating from a center region, but is not limited thereto. The first and second recesses R1 and R2 may not be disposed in the lead electrodes 41 and 43.

The protection chip 51 may be implemented with a thyristor, a Zener diode, or a transient voltage suppression (TVS) device. The protection chip 51 may be connected to the light emitting chip 11 in parallel or in inversely parallel. The protection chip 51 may be a unidirectional diode or a bidirectional diode. The protection chip 51 protects the light emitting chip 11 from electro static discharge (ESD).

A length of one side of the protection chip 51 may be shorter than that of one side of the light emitting chip 11. A thickness of the protection chip 51 may be thinner than that of the light emitting chip 11 and that of the lead electrodes 41 and 43.

The light emitting device 10 may include a phosphor layer 61. The phosphor layer 61 may be disposed on a top surface of the light emitting chip 11. The phosphor layer 61 may disposed on the top surface of the light emitting chip 11 in contact with or apart from the top surface. The phosphor layer 61 may disposed on the top surface and a side surface of the light emitting chip 11 in contact with or apart from the top surface and the side surface.

A width or a top surface area of the phosphor layer 61 may be equal to or wider than a width or an area of the top surface of the light emitting chip 11. For example, as in FIG. 2, considering a length X2 of the phosphor layer 61 in the first axis direction and a length Y2 of the phosphor layer 61 in the second axis direction, a relationship "X2>X3" may be set, and a relationship "Y2>Y3>B2" may be set. The phosphor layer 61 may be disposed to have a size for covering the whole top surface of the light emitting chip 11, and thus, a wavelength conversion efficiency of light emitted from the light emitting chip 11 can be improved.

The phosphor layer 61 converts a wavelength of some lights emitted from the light emitting chip 11. The phosphor layer 61 may include a phosphor in silicon or epoxy resin, and the phosphor may include at least one of a red phosphor, a green phosphor, a blue phosphor, and a yellow phosphor. However, the present embodiment is not limited thereto. The phosphor may be formed of, for example, a material selected from among YAG, TAG, silicate, nitride, and an oxy-nitride-based material.

A width of the phosphor layer 61 may be wider than that of the light emitting chip 11 and may be narrower than that of each of the first and second support members 30 and 40, but is not limited thereto. A top surface of the phosphor layer 61 may include at least one of a convex surface, a concave surface, a planar surface, and a rough surface.

The reflective member 71 is disposed on a periphery of the light emitting chip 11. The reflective member 71 may be disposed on an outer periphery of the light emitting chip 11. The reflective member 71 may be disposed on an outer periphery of the support member 13. The reflective member 71 may be disposed on the first support member 30. The reflective member 71 seals an outer surface of the light emitting chip 11, thereby preventing penetration of moisture. A top surface 7 of the reflective member 71 is disposed higher than the top surface of the light emitting chip 11 and lower than the top surface of the phosphor layer 61, thereby decreasing a loss of side light from the light emitting chip 11 and improving light extraction efficiency based on the phosphor layer 61.

The reflective member 71 may be provided from a bottom surface, that is, a bottom surface of each of the first and second electrodes 21 and 23 of the light emitting chip 11 to a periphery of the top surface of the light emitting chip 11. If the light emitting device 10 includes the phosphor layer 61, the reflective member 71 may be disposed on a periphery from the bottom surface of the light emitting chip 11 to a height of the top surface of the phosphor layer 61. Here, the top surface of the phosphor layer 61 may be disposed on the same horizontal surface as or higher than a top surface 7 of the reflective member 71, but is not limited thereto. The phosphor layer 61 may be removed or disposed to be separated from the reflective member 71, but is not limited thereto.

The reflective member 71 is disposed on a periphery of each of the light emitting chip 11 and the phosphor layer 61 to reflect light incident from the light emitting chip 11 and the phosphor layer 61, thereby allowing light to be extracted through the phosphor layer 61. As another example, a transmissive light guide layer (not shown) may be disposed in a region between the reflective member 71 and the light emitting chip 11, for light extraction. The light guide layer may be formed of a transparent resin material between the reflective member 71 and the light emitting chip 11 and may guide light, emitted in a direction toward a side of the light emitting chip 11, in an up direction. The reflective member 71 may contact the light guide layer without directly contacting the light emitting chip 11, thereby reflecting light, traveling to the light guide layer, in an up direction. The light guide layer may be disposed to extend between the phosphor layer 61 and the reflective member 71. The light guide layer may be disposed between the phosphor layer 61 and the reflective member 71, thereby improving an adhesive force between the phosphor layer 61 and the reflective member 71.

The reflective member 71 may include a non-metal material or an insulating material, and for example, may be formed of a resin material such as silicon or epoxy. The reflective member 71 may include impurities having a refractive index which is higher than that of the resin material. At least one of compounds such as oxide, nitride, fluoride, and sulfide having at least one of Al, Cr, Si, Ti, Zn, and Zr may be added to the reflective member 71. The reflective member 71 may include, for example, at least one of $TiO_2$, $SiO_2$, and $Al_2O_3$.

A thickness of the reflective member 71 may be equal to or thinner than a sum of thicknesses of the light emitting chip 11 and the phosphor layer 61. A size of the light emitting device 10 may vary based on a size of the reflective member 71, and thus, a thickness of the light emitting device 10 may be set to a thin thickness.

Figure 3:
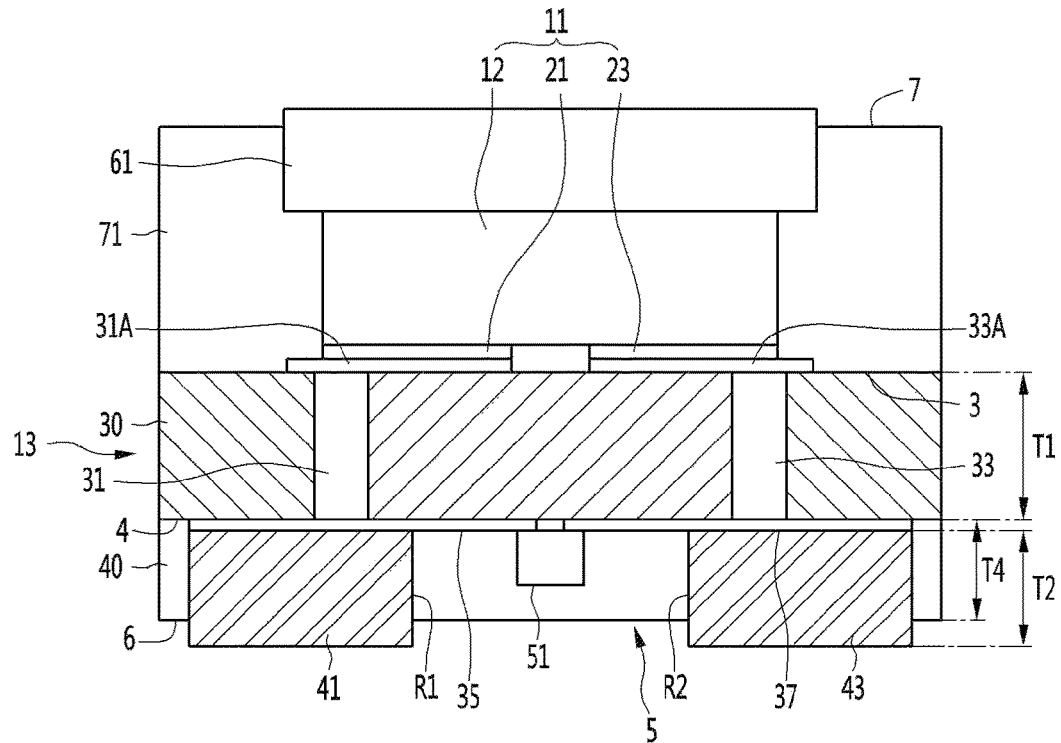
FIG. 3 is a modification example of the light emitting device of FIG. 1.

FIG. 3 is a modification example of the light emitting device of FIG. 1. In describing FIG. 4, the description of FIG. 1 is applied to the same elements as FIG. 1.

Referring to FIG. 3, in a light emitting device, first and second support members 30 and 40 may be disposed under a light emitting chip 11, and a reflective member 71 may be disposed on a periphery of the light emitting chip 11.

A protection chip 51 may be disposed in the second support member 40, and the protection chip 51 may be mounted under first and second metal layers 35 and 37 in a flip chip type. Therefore, an interval between the first and second lead electrodes 41 and 43 can be reduced. For example, a depth of each of first and second recesses R1 and R2 illustrated in FIG. 2 may be the same as a width B1 of a gap 5 of FIG. 2 or may be reduced in comparison with depths B4 and B5, and thus, a surface area of each of the first and second lead electrodes 41 and 43 can increase in comparison with a structure of FIG. 1.

As another example of FIG. 3, a transmissive light guide layer (not shown) may be disposed at a region between the reflective member 71 and the light emitting chip 11, for light extraction. The light guide layer may be formed of a transparent resin material between the reflective member 71 and the light emitting chip 11 and may guide light, emitted in a direction toward a side of the light emitting chip 11, in a top direction. The reflective member 71 may contact the light guide layer without directly contacting the light emitting chip 11, thereby reflecting light, traveling to the light guide layer, in the top direction. The light guide layer may be disposed to extend between the phosphor layer 61 and the reflective member 71. The light guide layer may be disposed between the phosphor layer 61 and the reflective member 71, thereby improving an adhesive force between the phosphor layer 61 and the reflective member 71.

Figure 4:
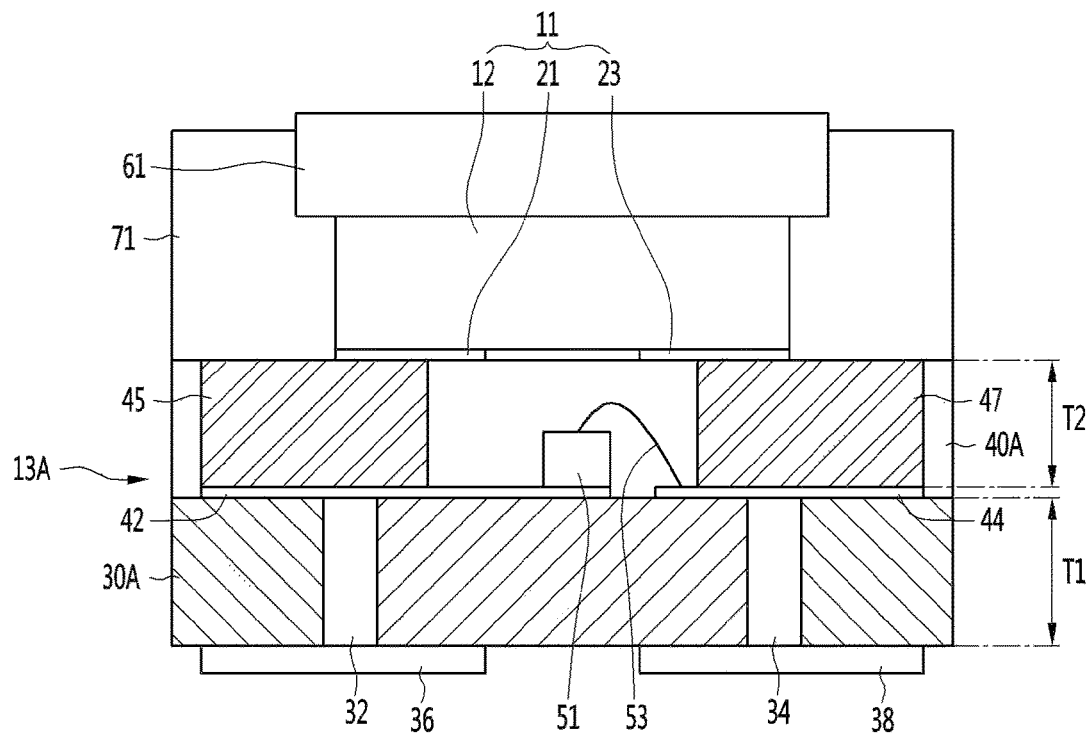
FIG. 4 is a side cross-sectional view of a light emitting device according to a second embodiment.

FIG. 4 is a side cross-sectional view of a light emitting device according to a second embodiment. In describing the second embodiment, elements of the first embodiment are applied to the same elements as the first embodiment.

Referring to FIG. 4, a light emitting device 10 includes a light emitting chip 11, a second support member 40A including a plurality of lead electrodes 45 and 47 under the light emitting chip 11, a first support member 30A including a plurality of via electrodes 31 and 33 under the second support member 40A, a protection chip 51 disposed between the plurality of lead electrodes 45 and 47, and a reflective member 71 disposed on a periphery of the light emitting chip 11.

The second embodiment provides a structure where the second support member 40A is disposed between the light emitting chip 11 and the first support member 30A. In the second embodiment, the second support member 40A is disposed on a top surface (3 of FIG. 1) or a bottom surface of the first support member 30A, thereby decreasing an impact caused by a thermal stress transferred to the light emitting chip 11.

The second support member 40A may include a resin material, for example, at least one of silicon, epoxy, fluoro resins (FR), and composite epoxy materials (CEM). The second support member 40A may include a thermal conductive film. The thermal conductive film may use polyester resins such as polyethylene terephthalate, polybutylene terephthalate-laid, and polyethylene terephthalate; polyimide resin; acrylic resin; styrene-based resin such as polystyrene and acrylonitrile-styrene; polycarbonate resin; polylactic acid resin; polyurethane resin, etc. Also, the thermal conductive film may include polyolefin resins such as polyethylene, polypropylene, and ethylene-propylene copolymer; vinyl resins such as polyvinyl chloride and polyvinylidene chloride; polyamide resin; sulfone-based resin; polyether-ether ketone-based resin; allylate-based resin; or at least one of blends of the resins.

The first and second lead electrodes 45 and 47 are disposed in the second support member 40A. The first and second lead electrodes 45 and 47 may be included in the second support member 40A or may be provided as separate metal support members, but are not limited thereto.

The first lead electrode 45 may be disposed under the first electrode 21, and the second lead electrode 47 may be disposed under the second electrode 23. The first and second lead electrodes 45 and 47 may be connected to the light emitting chip 11.

First and second metal layers 42 and 44 may be disposed under the second support member 40A, and a protection chip 51 may be disposed on at least one of the first and second metal layers 42 and 44. The protection chip 51 may be disposed on the first metal layer 42, and a wire 53 connected to the protection chip 51 may be connected to the second metal layer 44. The first and second lead electrodes 45 and 47 may have a structure of recesses R1 and R2 which are as illustrated in FIG. 2, and thus, the protection chip 51 and the wire 53 thereof may be disposed in the recesses R1 and R2.

The protection chip 51 may be sealed by the second support member 40A between the plurality of lead electrodes 45 and 47. The protection chip 51 is sealed to electrically protect the light emitting chip 11. Also, the protection chip 51 is buried in the second support member 40A, thereby decreasing a size of the light emitting device. As another example, the protection chip 51 may be mounted on the first and second metal layers 42 and 44 in a flip chip type, but is not limited thereto.

The protection chip 51 may be implemented with a thyristor, a Zener diode, or a transient voltage suppression (TVS) device. The protection chip 51 may be connected to the light emitting chip 11 in parallel or in inversely parallel. The protection chip 51 may be a unidirectional diode or a bidirectional diode. The protection chip 51 protects the light emitting chip 11 from electro static discharge (ESD).

A thickness T2 of each of the first and second lead electrodes 45 and 47 may be equal to a thickness of the second support member 40A, thereby improving head dissipation efficiency. The first and second lead electrodes 45 and 47 may be formed of at least one of gold (Au), nickel (Ni), chromium (Cr), tantalum (Ta), platinum (Pt), tin (Sn), silver (Ag), phosphorus (P), titanium (Ti), palladium (Pd), and copper (Cu), or a selective alloy thereof, and may be formed of a single layer or a multilayer. The first and second lead electrodes 45 and 47 may include, for example, copper or a copper alloy.

A first support member 30A is disposed under the second support member 40A. The first support member 30A may include a material which is higher in thermal conductivity than and lower in thermal resistance than a resin material. The first support member 30A may be formed of, for example, oxide, carbide, or nitride which is produced by combining a metal element such as silicon (Si), aluminum (Al), titanium (Ti), or zirconium (Zr) with oxygen, carbon, nitrogen, or the like. The first support member 30A may include nitride aluminum (AlN). As another example, the first support member 30A may include at least one of silicon carbide (SiC), alumina (Al2O3), zirconium oxide (ZrO2), silicon nitride (Si3N4), boron nitride (BN).

The first support member 30A includes via electrodes 32 and 34, and the via electrodes 32 and 34 include a first via electrode 32 connected to the first electrode 21 and a second via electrode 34 connected to the second electrode 23. The first and second via electrodes 32 and 34 may be formed to have the same height as a thickness T1 of the first support member 30A or may be formed higher than the thickness T1. The first and second via electrodes 32 and 34 may include a conductive material, for example, a metal material. The first and second via electrodes 32 and 34 may be formed of at least one of gold (Au), nickel (Ni), chromium (Cr), tantalum (Ta), platinum (Pt), tin (Sn), silver (Ag), phosphorus (P), titanium (Ti), palladium (Pd), and copper (Cu), or a selective alloy thereof, and may be formed of a single layer or a multilayer.

The descriptions of FIGS. 8 to 10 are applied to the thickness T2 of the lead electrodes 45 and 47 and the thickness T1 of the first support member 30A according to an embodiment. That is, although the lead electrodes 45 and 47 are applied to a top surface of the first support member 30A, the thicknesses T1 and T2 may be applied within a range disclosed in the first embodiment.

Third and fourth metal layers 36 and 38 may be disposed on a bottom surface of the first support member 30A, the third metal layer 36 may be connected to the first via electrode 31, and the fourth metal layer 38 may be connected to the second via electrode 34. The third metal layer 36 may overlap the first via electrode 32 in a vertical direction, and the fourth metal layer 38 may overlap the second via electrode 34 in the vertical direction.

The third and fourth metal layers 36 and 38 may be included in the second support member 40 or may be provided as separate bonding pads, but are not limited thereto.

The third and fourth metal layers 36 and 38 may be formed of at least one of gold (Au), nickel (Ni), chromium (Cr), tantalum (Ta), platinum (Pt), tin (Sn), silver (Ag), phosphorus (P), titanium (Ti), palladium (Pd), and copper (Cu), or a selective alloy thereof, and may be formed of a single layer or a multilayer. The third and fourth metal layers 36 and 38 are pads and may include gold (Au).

The light emitting device 10 may include a phosphor layer 61. The phosphor layer 61 may be disposed on a top surface of the light emitting chip 11. The phosphor layer 61 may disposed on the top surface of the light emitting chip 11 in contact with or apart from the top surface. The phosphor layer 61 may disposed on the top surface and a side surface of the light emitting chip 11 in contact with or apart from the top surface and the side surface. The phosphor layer 61 may be disposed to have a size for covering the whole top surface of the light emitting chip 11, and thus, a wavelength conversion efficiency of light emitted from the light emitting chip 11 can be improved. A top surface of the phosphor layer 61 may include at least one of a convex surface, a concave surface, a planar surface, and a rough surface.

A reflective member 71 is disposed on a periphery of the light emitting chip 11. The reflective member 71 may be disposed on an outer periphery of the light emitting chip 11 and an outer top surface of the second support member 40A. An outer surface of the light emitting chip 11 may be spaced apart from both side surfaces and all side surfaces of the reflective member 71, thereby preventing penetration of moisture.

The reflective member 71 may be provided from a bottom surface, that is, a bottom surface of each of the first and second electrodes 21 and 23 of the light emitting chip 11 to a periphery of the top surface of the light emitting chip 11. If the light emitting device 10 includes the phosphor layer 61, the reflective member 71 may be disposed on a periphery from the bottom surface of the light emitting chip 11 to a height of the top surface of the phosphor layer 61. Here, the top surface of the phosphor layer 61 may be disposed on the same horizontal surface as or higher than a top surface of the reflective member 71, but is not limited thereto. The phosphor layer 61 may be removed or disposed to be separated from the reflective member 71, but is not limited thereto.

The reflective member 71 may contact a top surface of the second support member 40A. The reflective member 71 may contact an outer side of the top surface of the second support member 40A and a top surface of each of the lead electrodes 45 and 47. Therefore, the reflective member 71 can prevent moisture from penetrating into an interface between the reflective member 71 and the second support member 40A. As another example, a transmissive light guide layer (not shown) may be disposed in a region between the reflective member 71 and the light emitting chip 11, for light extraction. The light guide layer may be formed of a transparent resin material between the reflective member 71 and the light emitting chip 11 and may guide light, emitted in a direction toward a side of the light emitting chip 11, in an up direction. The reflective member 71 may contact the light guide layer without directly contacting the light emitting chip 11, thereby reflecting light, traveling to the light guide layer, in an up direction. The light guide layer may be disposed to extend between the phosphor layer 61 and the reflective member 71. The light guide layer may be disposed between the phosphor layer 61 and the reflective member 71, thereby improving an adhesive force between the phosphor layer 61 and the reflective member 71.

An outer surface of the reflective member 71 may be disposed on the same vertical surface as an outer surface of the second support member 40A, but is not limited thereto.

The reflective member 71 is disposed on a periphery of each of the light emitting chip 11 and the phosphor layer 61 to reflect light incident from the light emitting chip 11 and the phosphor layer 61, thereby allowing light to be extracted through the phosphor layer 61.

The reflective member 71 may include a non-metal material or an insulating material, and for example, may be formed of a resin material such as silicon or epoxy. The reflective member 71 may include impurities having a refractive index which is higher than that of the resin material. At least one of compounds such as oxide, nitride, fluoride, and sulfide having at least one of Al, Cr, Si, Ti, Zn, and Zr may be added to the reflective member 71. The reflective member 71 may include, for example, at least one of $TiO_2$, $SiO_2$, and $Al_2O_3$.

Figure 5:
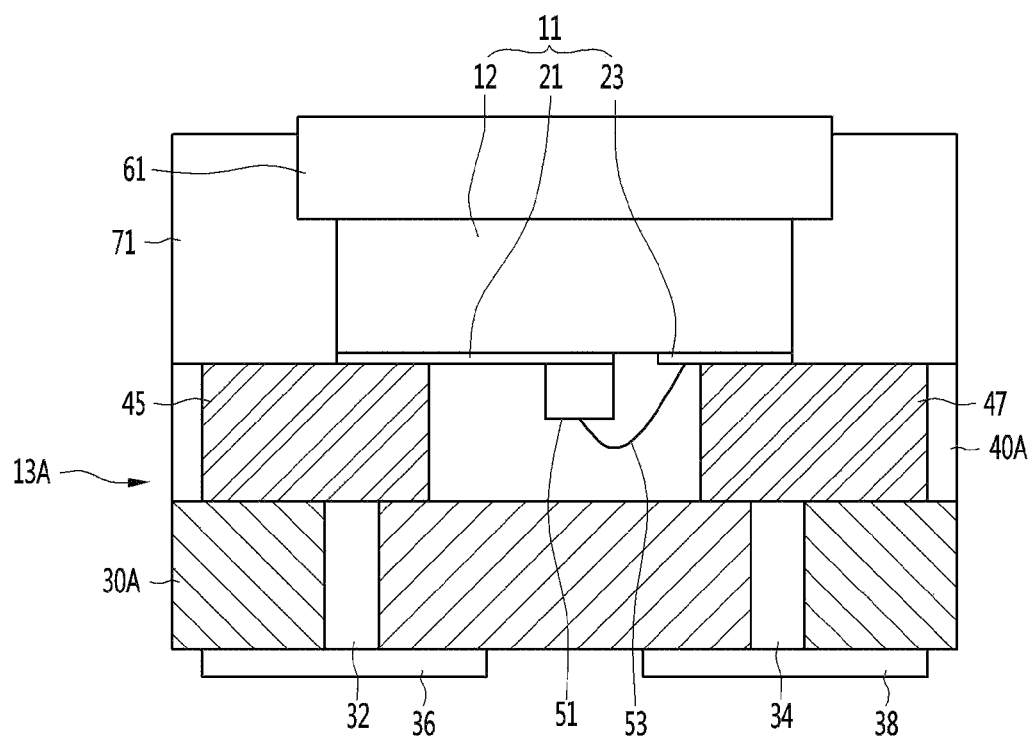
FIG. 5 is a modification example of the light emitting device of FIG. 4.

FIG. 5 is a modification example of the light emitting device of FIG. 4.

Referring to FIG. 5, in a light emitting device, a protection chip 51 may be connected to at least one of first and second electrodes 21 and 23 of a light emitting chip 11. The protection chip 51 may be disposed under the first electrode 21 and may be connected to the second electrode 23 by a wire 53. As another example, the protection chip 51 may be mounted under the first and second electrodes 21 and 23 in a flip chip type, but is not limited thereto.

The protection chip 51 and the wire 53 may be sealed in the second support member 40A. The protection chip 51 and the wire 53 may be disposed between a plurality of lead electrodes 45 and 47 in the second support member 40A. The plurality of lead electrodes 45 and 47 may have a structure of recesses R1 and R2 which are as illustrated in FIG. 2, and thus, the protection chip 51 and the wire 53 thereof may be disposed in the recesses R1 and R2. The protection chip 51 is directly connected to the light emitting chip 11, thereby protecting the light emitting chip 11 from ESD and facilitating a mount process of the protection chip 51. That is, the protection chip 51 may be mounted on the light emitting chip 11 and then may be inserted between the plurality of lead electrodes 45 and 47, and the second support member 40A may be molded.

As another example of FIG. 5, a transmissive light guide layer (not shown) may be disposed in a region between the reflective member 71 and the light emitting chip 11, for light extraction. The light guide layer may be formed of a transparent resin material between the reflective member 71 and the light emitting chip 11 and may guide light, emitted in a direction toward a side of the light emitting chip 11, in an up direction. The reflective member 71 may contact the light guide layer without directly contacting the light emitting chip 11, thereby reflecting light, traveling to the light guide layer, in an up direction. The light guide layer may be disposed to extend between the phosphor layer 61 and the reflective member 71. The light guide layer may be disposed between the phosphor layer 61 and the reflective member 71, thereby improving an adhesive force between the phosphor layer 61 and the reflective member 71.

Figure 6:
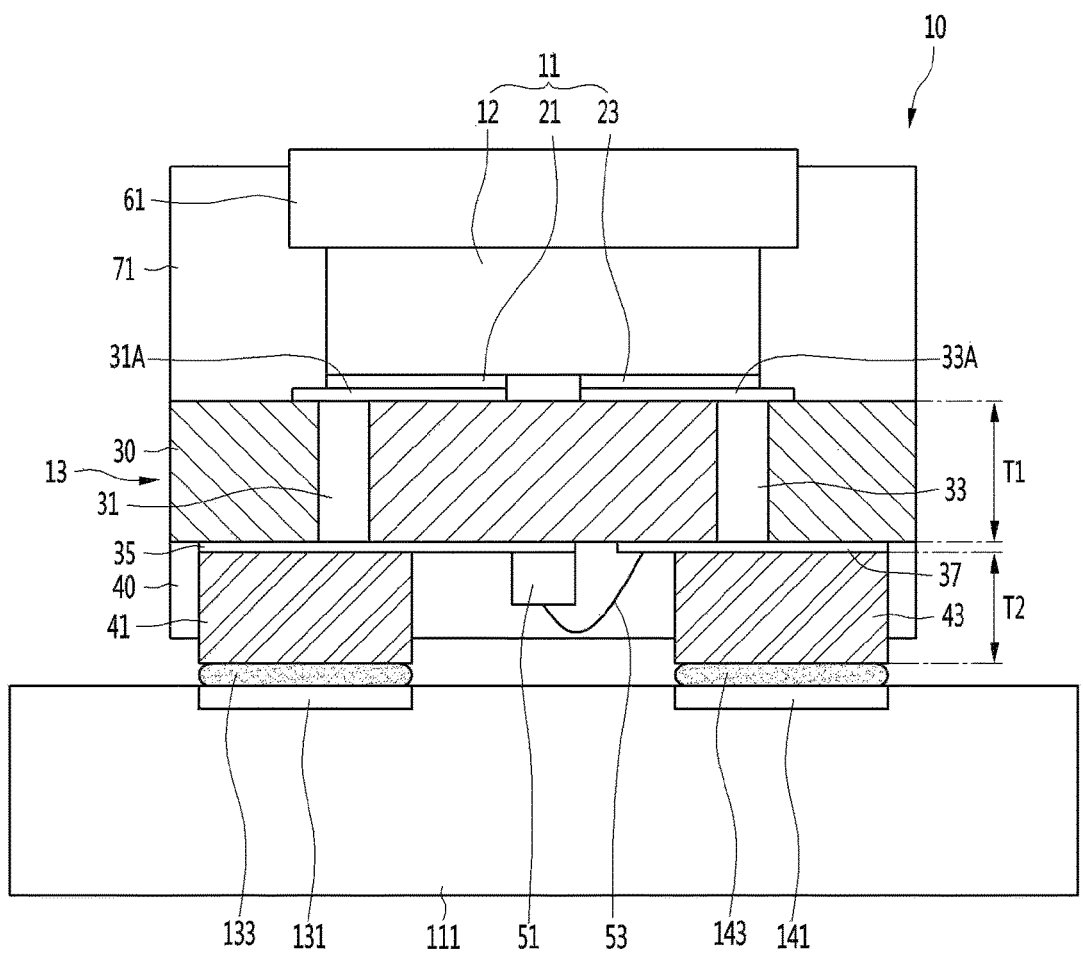
FIG. 6 is a side cross-sectional view of a light emitting module including a light emitting device according to an embodiment.

FIG. 6 is a side cross-sectional view of a light emitting module including a light emitting device according to an embodiment.

Referring to FIG. 6, the light emitting module includes a light emitting device 10, a circuit board 111 under the light emitting device 10, and first and second bonding members 133 and 134 between the circuit board 111 and the light emitting device 10.

The light emitting device 10 may include a light emitting device disclosed in an embodiment, and for example, may include a light emitting device disclosed in the first and second embodiments.

In the light emitting device 10, first and second lead electrodes 41 and 43 disposed in a lower portion may be disposed in corresponding with first and second electrode pads 131 and 141 of the circuit board 111. The circuit board 111 may include a circuit pattern including the first and second electrode pads 131 and 141.

The first bonding member 133 is disposed between the first lead electrode 41 and the first electrode pad 131 of the circuit board 111 to electrically connect the first lead electrode 41 to the first electrode pad 131.

The second bonding member 143 is disposed between the second lead electrode 43 and the second electrode pad 141 of the circuit board 111 to electrically connect the second lead electrode 43 to the second electrode pad 141.

The first and second bonding members 133 and 143 may include a solder paste material. The solder paste material includes at least one of gold (Au), tin (Sn), plumbum (Pb), copper (Cu), bismuth (Bi), indium (In), and silver (Ag). The first and second bonding members 133 and 143 directly conduct heat to the circuit board 111, and thus, thermal conduction efficiency can be improved.

As another example, the first and second bonding members 133 and 143 may include a conductive film, and the conductive film includes one or more conductive particles in an insulating film. The conductive particles may include, for example, metal or at least one of a metal alloy and carbon. The conductive particles may include at least one of nickel, silver, gold, aluminum, chromium, copper, and carbon. The conductive film may include an anisotropic conductive film or an anisotropic conductive adhesive.

An adhesive member (for example, a thermal conductive film) may be provided between the light emitting device 10 and the circuit board 111. The thermal conductive film may use polyester resins such as polyethylene terephthalate, polybutylene terephthalate-laid, and polyethylene terephthalate; polyimide resin; acrylic resin; styrene-based resin such as polystyrene and acrylonitrile-styrene; polycarbonate resin; poly-lactic acid resin; polyurethane resin, etc. Also, the thermal conductive film may include polyolefin resins such as polyethylene, polypropylene, and ethylene-propylene copolymer; vinyl resins such as polyvinyl chloride and polyvinylidene chloride; polyamide resin; sulfone-based resin; polyether-ether ketone-based resin; allylate-based resin; or at least one of blends of the resins.

The circuit board 111 may include at least one of a printed circuit board (PCB) including a resin material, a metal core PCB (MCPCB), a flexible PCB (FPCB), but is not limited thereto.

The light emitting device 10 may be provided in plurality, and the plurality of light emitting devices 10 may be disposed in at least one row, but is not limited thereto.

Herein, a stress applied to the light emitting chip 11 in a light emitting device of each of an embodiment and a comparative example will be described below. Here, the embodiment provides a stacked structure of the first support member 30 including a ceramic material and the lead electrodes 41 and 43 under the light emitting chip 11 as in FIG. 1, and the comparative example provides a structure where only a lead electrode is disposed under a light emitting chip. The light emitting device of the embodiment can uniformly distribute a thermal stress, applied to the light emitting chip 11, to a whole region. In the embodiment, the first support member 30 (i.e., a substrate including a ceramic material) blocks a thermal stress transferred from the lead electrode to the light emitting chip 11, and thus, the thermal stress can be uniformly distributed to a whole region of the lead electrode. In the comparative example, if only a lead electrode is disposed under a light emitting chip, a thermal stress transferred to the lead electrode is directly transferred to the light emitting chip, and thus, it can be seen that the thermal stress transferred to the light emitting chip is two or more times (for example, 2.5 or more times) higher than the embodiment.

Moreover, a stress applied to a bonding member in a light emitting device of each of an embodiment and a comparative example will be described below. The bonding member may be an example of a solder for bonding with a circuit board. The embodiment, as in FIG. 1, provides a structure where the first support member 30 including a ceramic material and the lead electrodes 41 and 43 are stacked under the light emitting chip 11, and the lead electrodes 41 and 43 are bonded to a circuit board by a bonding member. The comparative example corresponds to a case where an AlN substrate/AlN substrate are stacked under a light emitting chip and are bonded to a circuit board by a bonding member. In the light emitting device of the embodiment, a thermal stress transferred to the bonding member is distributed based on thicknesses of the plurality of lead electrodes 41 and 43, having similar thermal expansion coefficients, of the second support member 40, and thus, a thermal stress in the bonding member can be reduced. Also, since the thermal stress is reduced, a crack of the bonding member can be prevented. For example, the comparative example provides a structure where a ceramic substrate is stacked in plurality, and since the plurality of ceramic substrates have a thermal expansion coefficient difference with the bonding member, there is a problem where it is unable to reduce the thermal stress transferred to the bonding member. In the comparative example, a crack of the bonding member occurs, and the crack of the bonding member can cause a problem where it is unable to open an electrical connection of the light emitting device.

Figure 7:
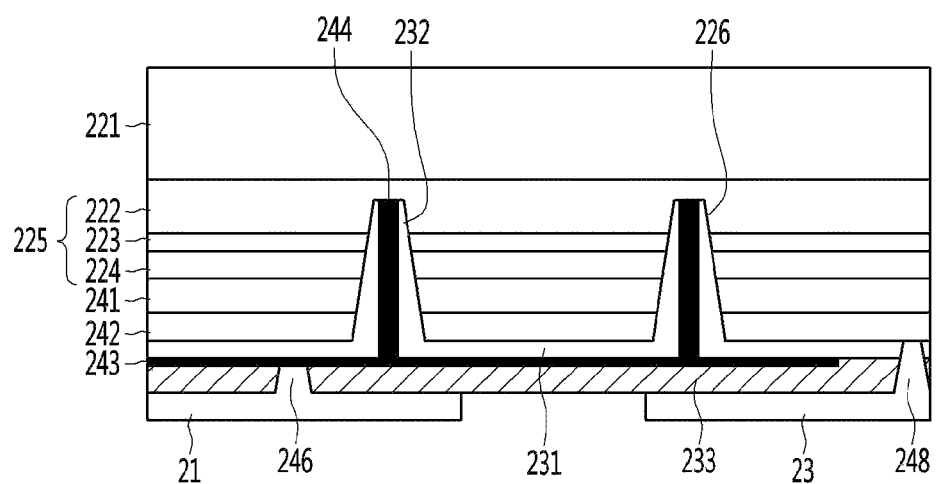
FIG. 7 is a diagram illustrating a light emitting chip of a light emitting device according to an embodiment.

FIG. 7 is a view illustrating example of a light emitting chip according to an embodiment.

Referring to FIG. 7, the light emitting chip 11 includes a light emitting structure 225 and a plurality of electrodes 21 and 23. The light emitting structure 225 may be provided as the group II to VI compound semiconductor layer, the group III-V compound semiconductor layer, or the group II-VI compound semiconductor layer. The plurality of electrodes 21 and 23 may be selectively connected to the semiconductor layer of the light emitting structure 225 to supply power. The light emitting structure 225 may include a first conductive type semiconductor layer 222, an active layer 223, and a second conductive type semiconductor layer 224.

The light emitting chip may include a substrate 221. The substrate 221 may be disposed on the light emitting structure 225. The substrate 221 may be, for example, a light transmissive or insulation substrate or a conductive substrate. For example, the substrate 221 may be use at least one of sapphire (Al2O3), SiC, Si, GaAs, GaN, ZnO, Si, GaP, InP, Ge, and Ga2O3. A plurality of convex portions (not shown) may be disposed on at least one or all of top and bottom surfaces of the substrate 221 to improve light extraction efficiency. Each of the convex portions may include a hemispheric shape, a semi-elliptical surface, or a polygonal shape in a side cross-section. Here, the substrate 221 may be removed from the inside of the light emitting chip, but is not limited thereto.

The light emitting chip 11 may include at least one of a buffer layer (not shown) and an undoped semiconductor layer (not shown) between the substrate 221 and the light emitting structure 225. The buffer layer may be a layer for reducing a lattice constant different between the substrate 221 and the semiconductor layer and may be made of a material selected from the group II to VI compound semiconductors. An undoped group III-V compound semiconductor layer may be further disposed under the buffer layer 112, but is not limited thereto. The substrate 221 may be removed. When the substrate is removed, the phosphor layer 61 may come into contact with a top surface of the first conductive type semiconductor layer 222 or a top surface of the other semiconductor layer.

The light emitting structure 225 may be disposed under the substrate 221 and includes a first conductive type semiconductor layer 222, an active layer 223 and a second conductive type semiconductor layer 224. The other semiconductor layer may be further disposed on at least one of top and bottom surfaces of each of the layers 222, 223 and 224, but is not limited thereto.

The first conductive type semiconductor layer 222 may be disposed under the substrate 221 and realized as a semiconductor into which a first conductive type dopant is doped, e.g., an n-type semiconductor layer. The first conductive type semiconductor layer 222 may include a semiconductor material having a compositional formula of $In_xAl_yGa_{1-x-y}N$ ($0 \leq x \leq 1$, $0 \leq y \leq 1$, $0 \leq x+y \leq 1$). The first conductive type semiconductor layer 222 may be made of a material selected from the group III-V compound semiconductors, e.g., GaN, AlN, AlGaN, InGaN, InN, InAlGaN, AlInN, AlGaAs, GaP, GaAs, GaAsP, and AlGaInP. The first conductive type dopant may be an n-type dopant and include a dopant such as Si, Ge, Sn, Se, and Te.

The active layer 223 may be disposed under the first conductive type semiconductor layer 222 and have one of a single quantum well structure, a multi quantum well (MQW) structure, a quantum wire structure, and a quantum dot structure and also have a cycle of a wall layer and a barrier layer. The cycle of the wall layer/barrier layer includes, for example, at least one of pairs of InGaN/GaN, GaN/AlGaN, AlGaN/AlGaN, InGaN/AlGaN, InGaN/InGaN, AlGaAs/GaA, InGaAs/GaAs, InGaP/GaP, AlInGaP/InGaP, and InP/GaAs.

The second conductive type semiconductor layer 224 is disposed under the active layer 223. The second conductive type semiconductor layer 224 may include a semiconductor, into which a second conductive type dopant is doped, having a compositional formula of InxAlyGal-x-yN ($0 \leq x < 1$, $0 \leq y \leq 1$, $0 \leq x+y \leq 1$). For example, the second conductive type semiconductor layer 224 may be made of at least one of compound semiconductors such as GaN, InN, AlN, InGaN, AlGaN, InAlGaN, AlInN, AlGaAs, GaP, GaAs, GaAsP, and AlGaInP. The second conductive type semiconductor layer 224 may be a p-type semiconductor layer, and the first conductive type dopant may include Mg, Zn, Ca, Sr, or Ba as a p-type dopant.

For another example of the light emitting structure 225, the first conductive type semiconductor layer 222 may be realized as a p-type semiconductor layer, and the second conductive type semiconductor layer 224 may be realized as an n-type semiconductor layer. Also, a third conductive type semiconductor layer having a polarity opposite to that of the second conductive type semiconductor layer may be disposed under the second conductive type semiconductor layer 224. Also, the light emitting structure 225 may have one structure of an n-p junction structure, a p-n junction structure, an n-p-n junction structure and a p-n-p junction structure.

Pads 21 and 23 may be disposed on a lower portion of the light emitting chip 11. The first electrode 21 is electrically connected to the first conductive type semiconductor layer 222, and the second electrode 23 is electrically connected to the second conductive type semiconductor layer 224. Each of the first and second electrodes 21 and 23 may have a bottom shape having a polygonal or circular shape.

The light emitting chip 11 includes first and second electrode layers 241 and 242, a third electrode layer 243, and insulation layers 231 and 233. Each of the first and second electrode layers 241 and 242 may have a single or multi-layered structure and function as a current spreading layer. The first and second electrode layers 241 and 242 may include a first electrode layer 241 disposed under the light emitting structure 225 and a second electrode layer 242 disposed under the first electrode layer 241. The first electrode layer 241 may spread current, and the second electrode layer 241 may reflect incident light.

The first and second electrode layers 241 and 242 may be made of materials different from each other. The first electrode layer 241 may be made of a light transmissive material, for example, metal oxide or metal nitride.

The first electrode layer 241 may be made of a material selected from indium tin oxide (ITO), ITO nitride (ITON), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), and gallium zinc oxide (GZO).

The second electrode layer 242 may come into contact with a bottom surface of the first electrode layer 241 and function as a reflective electrode layer. The second electrode layer 242 may be made of a metal, for example, Ag, Au, or Al. When a portion of a region of the first electrode layer 241 is removed, the second electrode layer 242 may come into partial contact with the bottom surface of the light emitting structure 225.

For another example, the first and second electrode layers 241 and 242 may be laminated with an Omni directional reflector layer (ODR) structure. The ODR structure may be a structure in which the first electrode layer 241 having a low refractive index and the second electrode layer 242 coming into contact with the first electrode layer 241 and made of a metal material having high reflectivity are laminated. The electrode layers 241 and 242 may have, for example, a laminated structure of ITO/Ag. A total orientation reflection angle may be improved at an interface between the first electrode layer 241 and the second electrode layer 242.

For another example, the second electrode layer 242 may be removed or provided as a reflective layer made of different material. The reflective layer may have a distributed Bragg reflector (DBR) structure. The DBR structure may include a structure in which two dielectric layers having different refractive indexes are alternately disposed, for example, may include one of a $SiO_2$ layer, a $Si_3N_4$ layer, a $TiO_2$ layer, an $Al_2O_3$ layer, and an MgO layer. For another example, the electrode layers 241 and 242 may include all of the DBR structure and the ODR structure. In this case, the light emitting chip having light reflectivity of 98% or more may be provided. Since the light emitting chip mounted in the flip manner emits light reflected from the second electrode layer 242 through the substrate 221, most of light may be released in a vertical upward direction.

Also, light emitted from a side surface of the light emitting chip may be reflected toward a light output region by the reflective member according to the embodiments.

The third electrode layer 243 may be disposed under the second electrode layer 242 and electrically insulated from the first and second electrode layers 241 and 242. The third electrode layer 243 may be made of a metal, for example, at least one of Ti, Cu, Ni, Au, Cr, Ta, Pt, Sn, Ag, and P. The first electrode 21 and the second electrode 23 are disposed under the third electrode layer 243.

The insulation layers 231 and 233 may prevent unnecessary contact between the layers of the first and second electrode layers 241 and 242, the third electrode layer 243, the first and second electrodes 21 and 23, and the light emitting structure 225 from occurring. The insulation layers 231 and 233 include first and second insulation layers 231 and 233. The first insulation layer 231 is disposed between the third electrode layer 243 and the second electrode layer 242. The second insulation layer 233 is disposed between the third electrode layer 243 and the first/second electrodes 21 and 23.

The third electrode layer 243 is connected to the first conductive type semiconductor layer 222. The connection part 244 of the third electrode layer 243 protrudes from a via structure through the first and second electrode layers 241 and 242 and the light emitting structure 225 to come into contact with the first conductive type semiconductor layer 222. The connection part 244 may be provided in plurality. A portion 232 of the first insulation layer 231 extends to the surrounding of the connection part 224 of the third electrode layer 243 to prevent the third insulation layer 243, the first and second electrode layers 241 and 242, the second conductive type semiconductor layer 224, and the active layer 223 from being electrically connected to each other. An insulation layer may be disposed on a side surface of the light emitting structure 225 to protect the side surface, but is not limited thereto.

The second electrode 23 is disposed under the second insulation layer 233 and comes into contact with or is connected to at least one of the first and second electrode layers 241 and 242 through an opened region of the second insulation layer 233. The first electrode 21 is disposed under the second insulation layer 233 and connected to the third electrode layer 243 through the opened region of the second insulation layer 233. Thus, a protrusion 248 of the first electrode 23 is electrically connected to the second conductive type semiconductor layer 224 through the first and second electrode layers 241 and 242, and a protrusion 246 of the second electrode 21 is electrically connected to the first conductive type semiconductor layer 222 through the third electrode layer 243.

Such a light emitting device or a light emitting module may be applied to a display device such as a portable terminal, a monitor of a notebook computer, a monitor of a laptop computer, a TV, or applied to a vehicle lamp, a three-dimensional display, various illumination lamps, a traffic lamp, a vehicle headlight, or a display board.

Features, structures, and effects described in the above embodiments are incorporated into at least one embodiment, but are not limited to only one embodiment. Moreover, features, structures, and effects exemplified in one embodiment can easily be combined and modified for another embodiment by those skilled in the art. Therefore, these combinations and modifications should be construed as falling within the scope of the present invention.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

Embodiments can improve a heat dissipation efficiency of a light emitting device including a light emitting chip.

Embodiments can improve a heat dissipation efficiency of a light emitting device including a light emitting chip and a protection chip.

Embodiments can improve the reliability of a light emitting device where a light emitting chip and a protection chip are packaged.

In embodiments, a reflective member is disposed on a periphery of a light emitting chip, thereby improving light extraction efficiency.

A light emitting device according to embodiments may be applied to lighting devices such as lighting lamps, indicating lamps, vehicle lamps, and backlight units.

The invention claimed is:

1. A light emitting device comprising:
a light emitting chip including a light emitting part, including a plurality of semiconductor layers, and a first electrode and a second electrode under the light emitting part;
a first support member under the light emitting chip;
a second support member under the first support member;
a first lead electrode connected to the first electrode and a second lead electrode connected to the second electrode, in the second support member, the first lead electrode being separated from the second lead electrode;
a protection chip disposed between the first and second lead electrodes; and
a reflective member disposed on a periphery of the light emitting chip,
wherein the first support member includes a ceramic material between the second support member and the light emitting chip, and
wherein a thickness of the first and second lead electrodes is equal to or greater than one half of a thickness of the first support member and is equal to or less than the thickness of the first support member.

2. The light emitting device of claim 1, wherein the second support member has a thickness which is greater than the thickness of the first and second lead electrodes, and covers the protection chip.

3. The light emitting device of claim 1, comprising
a first recess recessed in the first lead electrode; and
a second recess recessed in the second lead electrode,
wherein the protection chip is disposed in the first recess.

4. The light emitting device of claim 3, wherein an end portion of a wire connected to the protection chip is disposed in the second recess,
the wire is sealed by the second support member, and
the first recess and the second recess are disposed to face each other.

5. The light emitting device of claim 1, wherein the first support member comprises:
a first via electrode connected to the first electrode; and
a second via electrode connected to the second electrode, and
the light emitting device comprises:
a first metal layer disposed between the first and second support members and connected to the first via electrode and the first lead electrode; and
a second metal layer disposed between the first and second support members and connected to the second via electrode and the second lead electrode.

6. The light emitting device of claim 5, wherein the protection chip is disposed under the first and second metal layers in a flip chip type.

7. The light emitting device of claim 1, comprising a phosphor layer on the light emitting chip,
wherein the phosphor layer has an area which is greater than an area of a top surface of the light emitting chip,
the reflective member is disposed on a periphery of the phosphor layer, and
a top surface of the phosphor layer protrudes further than a top surface of the reflective member.

8. The light emitting device of claim 1, wherein the first support member comprises nitride aluminum,
the second support member comprises a resin material or a thermal conductive film, and
the first and second lead electrodes comprise copper.

9. The light emitting device of claim 8, wherein the thickness of the first support member is in a range of 0.18 mm to 0.3 mm, and
when the thickness of the first and second lead electrodes is T2 and the thickness of the first support member is T1, a ratio of T2/(T1+T2) is in a range of 40% to 60%.

10. The light emitting device of claim 8, wherein the reflective member comprises impurities having a refractive index, which is higher than a refractive index of the resin material, in the resin material.

11. A light emitting device comprising:
a light emitting chip including a light emitting part, including a plurality of semiconductor layers and a transmissive substrate, and a first electrode and a second electrode under the light emitting part;
a first support member under the light emitting chip;
a second support member between the first support member and the light emitting chip;

a first lead electrode connected to the first electrode and a second lead electrode connected to the second electrode, in the second support member, the first lead electrode being separated from the second lead electrode;

a protection chip disposed between the first and second lead electrodes; and a reflective member disposed on a periphery of the light emitting chip, wherein the first support member includes a ceramic material, and wherein the second support member has a thickness which is equal to a thickness of the first and second lead electrodes, and covers the protection chip.

12. The light emitting device of claim 11, comprising a first recess recessed in the first lead electrode; and a second recess recessed in the second lead electrode, wherein the protection chip is disposed under the light emitting chip.

13. The light emitting device of claim 12, wherein an end portion of a wire connected to the protection chip is disposed in the second recess, and the wire is sealed by the second support member.

14. The light emitting device of claim 11, wherein the first support member comprises:

a first via electrode connected to the first electrode; and a second via electrode connected to the second electrode, and the light emitting device comprises a plurality of metal layers disposed under the first support member and connected to the first and second via electrodes.

15. The light emitting device of claim 11, comprising a phosphor layer on the light emitting chip, wherein the phosphor layer has an area which is greater than an area of a top surface of the light emitting chip, the reflective member is disposed on a periphery of the phosphor layer, and a top surface of the phosphor layer protrudes further than a top surface of the reflective member.

16. The light emitting device of claim 11, wherein the first support member comprises nitride aluminum, the second support member comprises a resin material or a thermal conductive film, the first and second lead electrodes comprise copper, and the thickness of the first and second lead electrodes is equal to or greater than one half of a thickness of the first support member and is equal to or less than the thickness of the first support member.

17. The light emitting device of claim 16, wherein when the thickness of the first and second lead electrodes is T2 and the thickness of the first support member is T1, a ratio of T2/(T1+T2) is in a range of 40% to 60%.

18. The light emitting device of claim 11, comprising a light guide layer including a transparent resin material between the light emitting chip and the reflective member.

19. The light emitting device of claim 11, wherein the protection chip is disposed on the first support member.

20. A light emitting module comprising:

a light emitting device including: a light emitting chip including a light emitting part, including a plurality of semiconductor layers, and a first electrode and a second electrode under the light emitting part; a first support member under the light emitting chip; a second support member under the first support member; a first lead electrode connected to the first electrode and a second lead electrode connected to the second electrode, in the second support member, the first lead electrode being separated from the second lead electrode; a protection chip disposed between the first and second lead electrodes; and a reflective member disposed on a periphery of the light emitting chip, wherein the first support member includes a ceramic material between the second support member and the light emitting chip;

a circuit board including first and second electrode pads under the light emitting device; and a bonding member disposed between the circuit board and the light emitting device, wherein the first and second lead electrodes of the light emitting device are connected to the first and second electrode pads of the circuit board by the bonding member, and wherein a thickness of the first and second lead electrodes is equal to or greater than one half of a thickness of the first support member and is equal to or less than the thickness of the first support member.

* * * * *